(12) United States Patent  (10) Patent No.: US 8,601,674 B2
Parks  (45) Date of Patent: Dec. 10, 2013

(54) METHOD FOR PRODUCING AN IMAGE SENSOR WITH CHARGE MULTIPLICATION OUTPUT CHANNEL AND CHARGE SENSING OUTPUT CHANNEL

(75) Inventor: Christopher Parks, Rochester, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 311 days.

(21) Appl. No.: 12/973,134

(22) Filed: Dec. 20, 2010

(65) Prior Publication Data

US 2012/0151753 A1  Jun. 21, 2012

(51) Int. Cl.
*H01H 11/00* (2006.01)
*H01H 65/00* (2006.01)

(52) U.S. Cl.
USPC .............................................. 29/622; 29/825

(58) Field of Classification Search
USPC ......... 29/622, 592.1, 825; 348/250, 302, 311, 348/314, 315, 317
See application file for complete search history.

(56) References Cited

U.S. PATENT DOCUMENTS

| | | |
|---|---|---|
| 4,811,068 A | 3/1989 | Kinoshita |
| 5,086,344 A | 2/1992 | D'Luna et al. |
| 5,210,613 A | 5/1993 | Lee |
| 7,190,400 B2 | 3/2007 | Hynecek |
| 7,420,605 B2 * | 9/2008 | Pool et al. ............... 348/311 |
| 8,395,689 B2 | 3/2013 | Parks |
| 2003/0035057 A1 | 2/2003 | Hakamata et al. |
| 2007/0229691 A1 | 10/2007 | Oshima et al. |
| 2008/0230680 A1 | 9/2008 | Yatokoro |
| 2011/0273603 A1 * | 11/2011 | Suzuki et al. ............ 348/311 |
| 2012/0144656 A1 | 6/2012 | Parks |
| 2012/0147235 A1 | 6/2012 | Parks |
| 2012/0147236 A1 | 6/2012 | Parks |
| 2012/0147239 A1 | 6/2012 | Parks |
| 2012/0147240 A1 | 6/2012 | Parks |
| 2012/0154620 A1 | 6/2012 | Parks |
| 2012/0154652 A1 | 6/2012 | Parks |

OTHER PUBLICATIONS

U.S. Appl. No. 12/973,108—Non-Final Office Action, mailed Mar. 20, 2013, 8 pages.

* cited by examiner

*Primary Examiner* — Thiem Phan
(74) *Attorney, Agent, or Firm* — Blakely Sokoloff Taylor & Zafman LLP

(57) ABSTRACT

A method for producing an image sensor includes: providing a horizontal shift register electrically connected to a pixel array for receiving charge packets from the pixel array; providing a non-destructive sense node connected to an output of the horizontal shift register; providing a charge directing switch electrically connected to the non-destructive sense node, where the charge directing switch includes first and second outputs; providing a charge multiplying horizontal shift register electrically connected to the first output of the charge directing switch; and providing a discharging element connected to the second output of the charge directing switch.

4 Claims, 7 Drawing Sheets

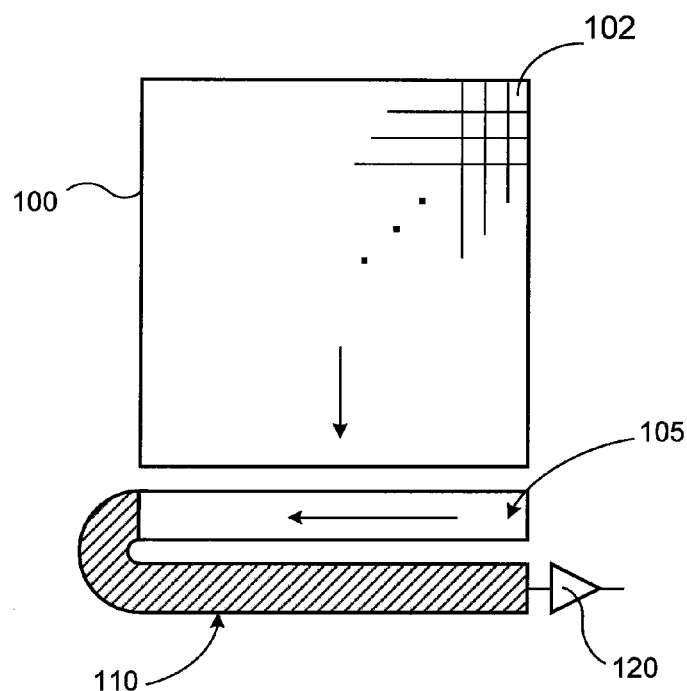
FIG. 1 - Prior Art
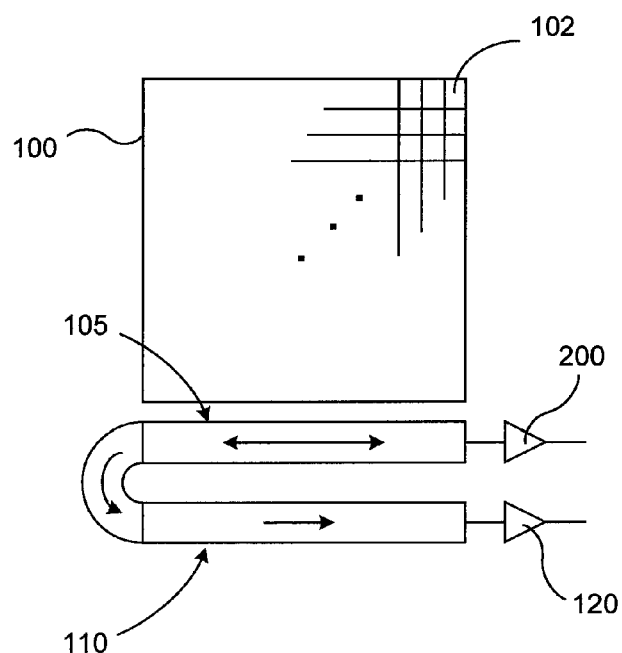
FIG. 2 - Prior Art

METHOD FOR PRODUCING AN IMAGE SENSOR WITH CHARGE MULTIPLICATION OUTPUT CHANNEL AND CHARGE SENSING OUTPUT CHANNEL

TECHNICAL FIELD

The present invention relates to image sensors for use in digital cameras and other types of image capture devices, and more particularly to Charge Coupled Device (CCD) image sensors. Still more particularly, the present invention relates to charge multiplication in CCD image sensors.

BACKGROUND

FIG. 1 depicts a simplified block diagram of a first CCD image sensor that performs charge multiplication in accordance with the prior art. Pixel array 100 includes vertical charge-coupled device (CCD) shift registers (not shown) that shift charge packets from a row of pixels 102 one row at a time into low voltage horizontal CCD (HCCD) shift register 105. Low voltage HCCD shift register 105 serially shifts the charge packets into a high voltage charge multiplying HCCD shift register 110. Charge multiplication occurs in charge multiplying HCCD shift register 110 through the application of large electric fields to the gate electrodes (not shown) overlying HCCD shift register 110 during charge transfer. The large electric fields produce a signal larger than originally collected in the pixels in pixel array 100. The large electric fields are created by overdriving the gate electrodes over the extended HCCD shift register 402 with sufficiently larger voltages. Typically, charge multiplying HCCD shift register 110 can multiply the number of charge carriers in each charge packet by a factor of two to one thousand. The multiplied charge packet output at the end of charge multiplying HCCD shift register 110 is sensed and converted into a voltage signal by output amplifier 120.

A conventional output amplifier can have a minimum noise level of eight charge carriers, meaning the output amplifier is unable to detect a signal when a charge packet contains less than eight charge carriers. One advantage of a multiplying HCCD shift register 110 is the ability to amplify or multiple charge packets that would not normally be detected by an output amplifier. For example, a charge multiplying HCCD shift register can take an input of just one undetectable charge carrier (e.g., electron) and convert it to a larger detectable group of one thousand charge carriers. The output amplifier is now able to detect the charge packet and convert the charge packet to a voltage signal.

One major drawback of a charge multiplying HCCD shift register is its dynamic range. If the charge packet entering the multiplying HCCD shift register has two hundred charge carriers and if the gain is one thousand, the two hundred charge carriers are multiplied to 200,000 charge carriers. Many charge multiplying HCCD shift registers are unable to hold 200,000 or more charge carriers, so the charge carriers bloom (spread out) into the pixels adjacent to the HCCD shift register. When the capacity of the charge multiplying HCCD shift register is 200,000 charge carriers and the gain is one thousand, the maximum signal that can be measured by a charge multiplying HCCD shift register is 200 charge carriers with a noise floor of one charge carrier. That is a dynamic range of 200 to 1. To illustrate how poor that dynamic range is, an output amplifier with a minimum noise level of eight electrons can easily measure charge packets containing 32,000 charge carriers for a dynamic range of 4000 to 1.

To overcome this limitation, prior art CCD image sensors (see FIG. 2) have added a second output amplifier 200 to HCCD shift register 105. If the image is known to contain charge packets too large for the charge multiplying HCCD shift register 110, the charge packets are serially shifted through HCCD shift register 105 to output amplifier 200 instead of towards the charge multiplying HCCD shift register 110. One disadvantage to this implementation is the entire image must be read out of either output amplifier 200 or output amplifier 120. If an image contains both bright and dark regions, the image must be read out of output amplifier 200 so the bright regions do not bloom (flood) the charge multiplying HCCD shift register 110. But when the entire image is read out of output amplifier 200, dark regions in the image are not shifted through the charge multiplying HCCD shift register and do not receive the benefit of charge multiplying HCCD shift register 110.

SUMMARY

An image sensor includes a horizontal shift register electrically connected to a pixel array for receiving charge packets from the pixel array. A non-destructive sense node is connected to an output of the horizontal shift register. A charge directing switch is electrically connected to the non-destructive sense node. The charge directing switch includes two outputs. A charge multiplying horizontal shift register is electrically connected to one output of the charge directing switch. A discharging element is connected to the other output of the charge directing switch.

A pipeline delay horizontal shift register can be connected between the non-destructive sense node and the charge directing switch. An extended horizontal shift register can be connected between the charge directing switch and the input of the charge multiplying horizontal shift register. Amplifiers can be connected to the non-destructive sense node and the output of the charge multiplying shift register.

The image sensor can be included in an image capture device. The image capture device can include correlated double sampling (CDS) units connected to the outputs of the amplifiers. The CDS units can each include an analog-to-digital converter. A computing device receives a digital pixel signal produced by the non-destructive sense node for each charge packet output from the horizontal shift register. The computing device produces a switch signal that is received by the charge directing switch and causes the charge directing switch to direct a charge packet to the charge multiplying horizontal shift register when the number of charge carriers in the charge packet will not saturate the charge multiplying horizontal shift register. The charge directing switch directs a charge packet to the discharging element connected to the other output of the charge directing switch when the charge packet will saturate the charge multiplying horizontal shift register.

The amplifier connected to the non-destructive sense node and the CDS unit connected to the amplifier combined form a charge sensing output channel having a combined charge to voltage conversion gain value G1. The amplifier connected to the output of the charge multiplying horizontal shift register and the CDS unit connected to the amplifier combined form a charge multiplying output channel having a combined charge to voltage conversion gain value G2. A method for producing an image includes selecting a pixel signal produced by either the charge sensing output channel or the charge multiplying output channel. If the pixel signal produced by the charge sensing output channel is selected, a gain ratio of (G2/G1) is applied to each pixel signal selected from the charge sensing output channel. The image is produced by combining the selected pixel signals.

A method for producing an image sensor includes providing a horizontal shift register electrically connected to a pixel array for receiving charge packets from the pixel array. A non-destructive sense node is provided that is connected to an output of the horizontal shift register. A charge directing switch is provided that is electrically connected to the non-destructive sense node. The charge directing switch includes first and second outputs. A charge multiplying horizontal shift register is provided that is electrically connected to the first output of the charge directing switch. A discharging element is provided that is connected to the second output of the charge directing switch. A method for producing an image capture device further includes providing a computing device that is electrically connected to the charge directing switch, where the computing device is operable to transmit a switch signal to the charge directing switch in response to a signal received from the non-destructive sense node.

BRIEF DESCRIPTION OF THE DRAWINGS

Embodiments of the invention are better understood with reference to the following drawings. The elements of the drawings are not necessarily to scale relative to each other.

FIG. 1 depicts a simplified block diagram of a first CCD image sensor that performs charge multiplication in accordance with the prior art;

FIG. 2 depicts a simplified block diagram of a second CCD image sensor that performs charge multiplication in accordance with the prior art;

DETAILED DESCRIPTION

Figure 3:
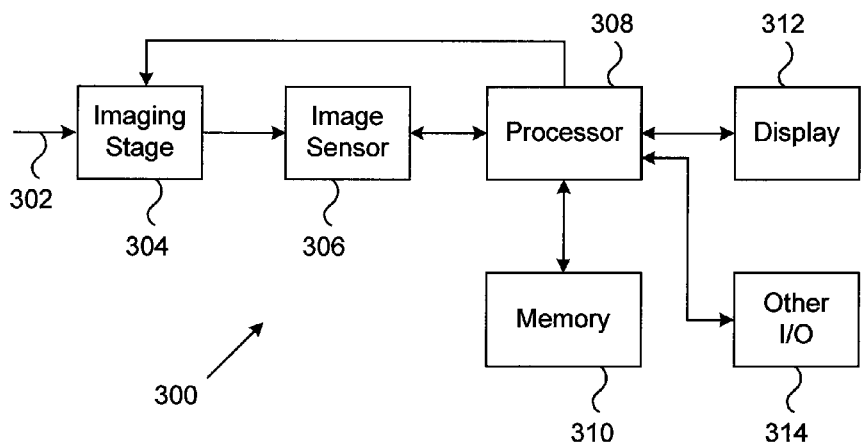
FIG. 3 is a simplified block diagram of an image capture device in an embodiment in accordance with the invention.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected, or an indirect connection through one or more passive or active intermediary devices. The term "circuit" means either a single component or a multiplicity of components, either active or passive, that are connected together to provide a desired function. The term "signal" means at least one current, voltage, charge, or data signal.

Additionally, the term "substrate layer" is to be understood as a semiconductor-based material including, but not limited to, silicon, silicon-on-insulator (SOI) technology, silicon-on-sapphire (SOS) technology, doped and undoped semiconductors, epitaxial layers or well regions formed on a semiconductor substrate, and other semiconductor structures.

Referring to the drawings, like numbers indicate like parts throughout the views.

FIG. 3 is a simplified block diagram of an image capture device in an embodiment in accordance with the invention. Image capture device 300 is implemented as a digital camera in FIG. 3. Those skilled in the art will recognize that a digital camera is only one example of an image capture device that can utilize an image sensor incorporating the present invention. Other types of image capture devices, such as, for example, cell phone cameras and digital video camcorders, can be used with the present invention.

In digital camera 300, light 302 from a subject scene is input to an imaging stage 304. Imaging stage 304 can include conventional elements such as a lens, a neutral density filter, an iris and a shutter. Light 302 is focused by imaging stage 304 to form an image on image sensor 306. Image sensor 306 captures one or more images by converting the incident light into electrical signals. Digital camera 300 further includes processor 308, memory 310, display 312, and one or more additional input/output (I/O) elements 314. Although shown as separate elements in the embodiment of FIG. 3, imaging stage 304 may be integrated with image sensor 306, and possibly one or more additional elements of digital camera 300, to form a compact camera module.

Processor 308 may be implemented, for example, as a microprocessor, a central processing unit (CPU), an application-specific integrated circuit (ASIC), a digital signal processor (DSP), or other processing device, or combinations of multiple such devices. Various elements of imaging stage 304 and image sensor 306 may be controlled by timing signals or other signals supplied from processor 308.

Memory 310 may be configured as any type of memory, such as, for example, random access memory (RAM), read-only memory (ROM), Flash memory, disk-based memory, removable memory, or other types of storage elements, in any combination. A given image captured by image sensor 306 may be stored by processor 308 in memory 310 and presented on display 312. Display 312 is typically an active matrix color liquid crystal display (LCD), although other types of displays may be used. The additional I/O elements 314 may include, for example, various on-screen controls, buttons or other user interfaces, network interfaces, or memory card interfaces.

It is to be appreciated that the digital camera shown in FIG. 3 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Figure 4:
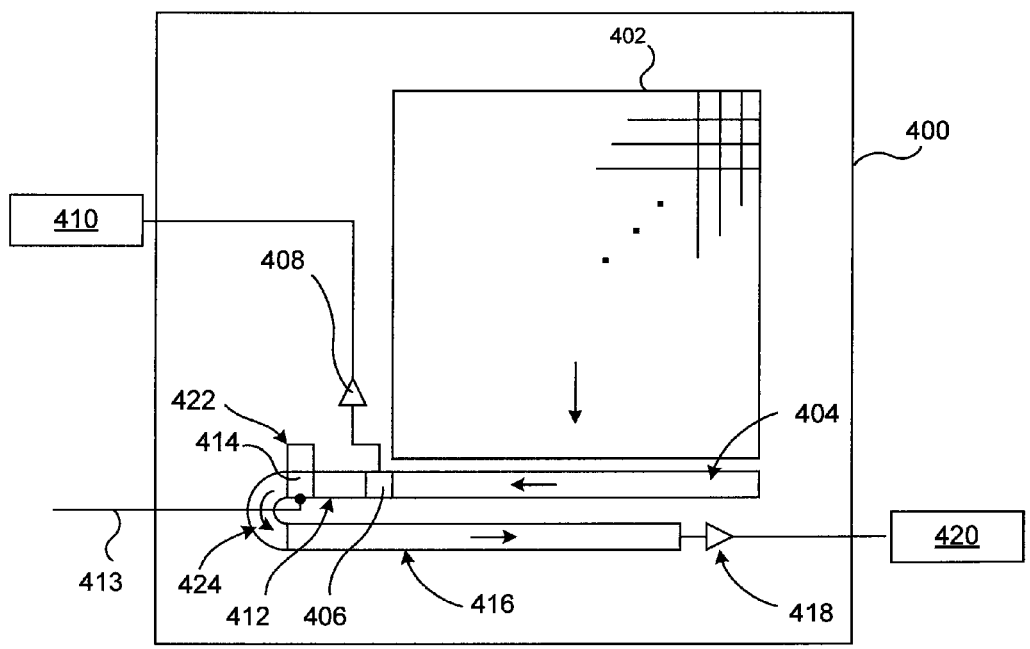
FIG. 4 is a simplified block diagram of a CCD image sensor suitable for use as image sensor 306 shown in FIG. 3 in an embodiment in accordance with the invention.

Referring now to FIG. 4, there is shown a simplified block diagram of a CCD image sensor suitable for use as image sensor 306 shown in FIG. 3 in an embodiment in accordance with the invention. Image sensor 400 can be implemented as any type of CCD image sensor, including, but not limited to, an interline CCD image sensor and full frame image sensor.

Image sensor 400 includes pixel array 402 having vertical shift registers (not shown) that shift charge packets from each row of pixels into horizontal shift register 404. Horizontal shift register 404 is implemented as a low voltage horizontal charge-coupled device (CCD) shift register in an embodiment in accordance with the invention. Horizontal shift register 404 serially shifts each charge packet towards non-destructive sense node 406. Non-destructive sense node 406 is implemented as a non-destructive floating gate sense node in an embodiment in accordance with the invention.

The voltage on non-destructive sense node 406 is input into amplifier 408. The output of output amplifier 408 is connected to output circuit 410. Output amplifier 408 and output circuit 410 together form a "charge sensing output channel". Output circuit 410 is implemented as a correlated double sampling (CDS) unit in an embodiment in accordance with the invention. The CDS unit can be configured in any one of various circuit implementations. By way of example only, a CDS unit can be configured to subtract the double samples (e.g., reset and image samples) in the analog domain and pass the result to an analog-to-digital converter. As another example, a CDS unit that is available from Analog Devices, part number AD9824, can be used for a CDS unit. The CDS unit may also be configured to digitally convert both samples and subtract the double samples in the digital domain as in U.S. Pat. No. 5,086,344.

Typically, an output circuit that includes an analog-to-digital converter has a pipeline processing delay. When the output circuit receives an analog pixel signal that is output from output amplifier 408, the corresponding digital pixel signal is not output from output circuit 410 until a given number of clock cycles have passed. A pipeline delay horizontal shift register is used in some embodiments in accordance with the invention to compensate for the pipeline processing delay of output circuit 410. In the illustrated embodiment, pipeline delay horizontal shift register 412 has a length that corresponds to the pipeline processing delay of output circuit 410. The length of pipeline delay horizontal shift register 412 is determined so that a charge packet that is sensed by non-destructive sense node 406 and passed to pipeline delay horizontal shift register 412 is output from pipeline delay horizontal shift register 412 and arrives at charge directing switch 414 at the same time or later as the digitized pixel signal is output from CDS unit 410. Pipeline delay horizontal shift register 412 can have different lengths in other embodiments in accordance with the invention.

A computing device (e.g., processor 308 in FIG. 3) analyzes the digital pixel signal output from output circuit 410 and transmits a switch signal on signal line 413 to charge directing switch 414. The computing device is constructed external to the image sensor die or chip in an embodiment in accordance with the invention. The computing device can be constructed on the image sensor die or chip in another embodiment in accordance with the invention.

If the digital pixel signal output from output circuit 410 represents a small amount or number of charge carriers, the switch signal on signal line 413 causes charge directing switch 414 to pass the charge packet onto charge multiplication horizontal shift register 416. The charge packet is then shifted through charge multiplying horizontal shift register 416 and input into output amplifier 418. Output amplifier 418 outputs an analog pixel signal representing the amount of charge carriers in the charge packet.

Output circuit 420 is connected to an output of output amplifier 418. Output amplifier 418 and output circuit 420 together form a "charge multiplying output channel". Output circuit 420 converts the analog pixel signal into a digital pixel signal. Output circuit 420 can perform additional processing of the pixel signal in some embodiments in accordance with the invention. Output circuit 420 is implemented as a CDS unit in an embodiment in accordance with the invention. The CDS unit can be configured in any one of multiple implementations.

If the digital pixel signal output from output circuit 410 represents a number of charge carriers that can saturate multiplying horizontal shift register 416, the switch signal on signal line 413 causes charge directing switch 414 to direct the charge packet to discharging element 422. Discharging element 422 is used to dump or drain charge packets that are not to be input into charge multiplying horizontal shift register 416. Discharging element 422 is implemented as a drain in an embodiment in accordance with the invention.

Extended horizontal shift register 424 serves as a connecting horizontal shift register between charge directing switch 414 and charge multiplying horizontal shift register 416. Extended horizontal shift register 424 operates at low voltage levels in an embodiment in accordance with the invention. Extended horizontal shift register 424 can be omitted in other embodiments in accordance with the invention.

Image sensor 400 produces one pixel signal for the charge packets that are not input into the charge multiplying output channel. The pixel signal is produced by charge sensing output channel. Image sensor 400 produces two pixel signals for the charge packets that are directed into the charge multiplying output channel. The digital pixel signals produced by output circuits 410 and 420 can be unsynchronized in terms of the time at which the digital pixel signal is output from the output circuits and the location of the charge packets in the image. Output circuit 410 will typically output a digital pixel signal for each charge packet faster than output circuit 420 because shifting the charge packet through charge multiplying horizontal shift register 416 takes more time. The digital pixel signals output from output circuits 410 and 420 are synchronized or re-ordered by the computing device (e.g., processor 308 in FIG. 3) in an embodiment in accordance with the invention. The computing device can store the state of the switch signal for each charge packet and use that data to re-order the digital pixels signals to reproduce the image.

Figure 5:
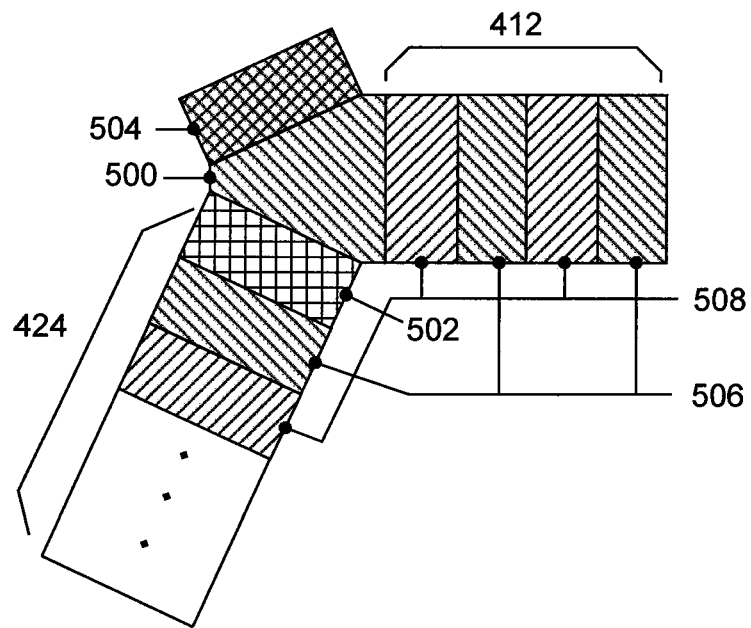
FIG. 5 depicts a simplified top view of charge directing switch 414 shown in FIG. 4 in an embodiment in accordance with the invention.

Referring now to FIG. 5, there is shown a simplified top view of charge directing switch 414 shown in FIG. 4 in an embodiment in accordance with the invention. Pipeline delay horizontal shift register 412 and extended horizontal shift register 424 are shown connected to charge directing switch 414. Charge directing switch 414 includes gates 500, 502, 504 that are disposed over charge shift elements in an embodiment in accordance. Charge directing switch 414 includes two outputs, one output is associated with gate 502 and the other output is associated with gate 504.

Pipeline delay horizontal shift register 412 and extended horizontal shift register 424 are each depicted as two phase CCD shift registers in the illustrated embodiment. Other embodiments in accordance with the invention are not limited to two phase CCD shift registers. CCD shift registers having three or more phases can be implemented in other embodiments.

Figure 6:
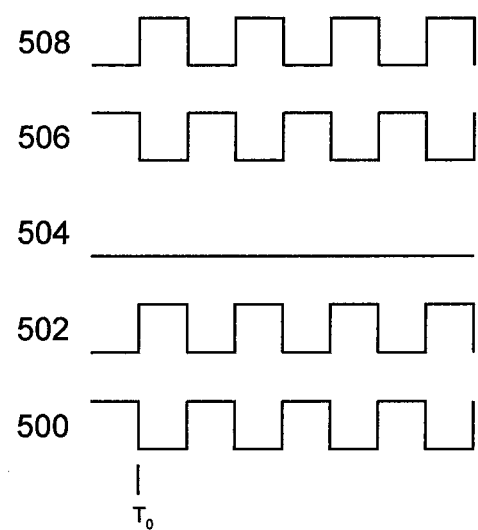
FIG. 6 illustrates a first exemplary timing diagram for charge directing switch 414 shown in FIG. 5.

The exemplary first timing diagram depicted in FIG. 6 is used to direct charge from pipeline delay horizontal shift register 412 to extended horizontal shift register 424. In embodiments that omit extended horizontal shift register 424, the timing diagram can be used to direct charge from pipeline delay horizontal shift register 412 to charge multiplying horizontal shift register 416. And finally, in embodiments that omit pipeline delay horizontal shift register 412, the timing diagram can be used to direct charge from non-destructive sense node 406 to either extended horizontal shift register 424 or charge multiplying horizontal shift register 416.

At time $T_0$, gate 500 is clocked to a low level while the signal on gate 504 is held at the low level and the signal on gate 502 is clocked to a high level. When the signals on gates 500 and 504 are at the low level and the signal on gate 502 is at the high level, charge flows out of the charge shift element under gate 500 and into the charge shift element below gate 502. The signals applied to the gates 506, 508 in extended horizontal shift register 424 are then clocked as shown in FIG. 6 to shift the charge packets through the extended horizontal shift register.

Figure 7:
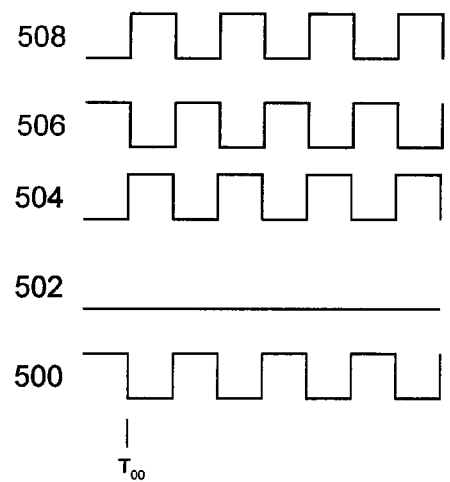
FIG. 7 depicts a second exemplary timing diagram for charge directing switch 414 shown in FIG. 5.

Referring now to FIG. 7, there is shown another exemplary timing diagram for charge directing switch 414 shown in FIG. 5. The exemplary timing diagram illustrated in FIG. 7 is used to direct charge from pipeline delay horizontal shift register 412 to discharging element 422 in an embodiment in accordance with the invention. When gate 500 is clocked to a given level (e.g., a low level) at time $T_{00}$, the signal on gate 502 is held at the low level and the signal on gate 504 is clocked to a high level. When the signals on gates 500 and 502 are at the low level and the signal on gate 504 is at the high level, charge flows out of the charge shift element disposed under gate 500 and into discharging element 422.

Figure 8:
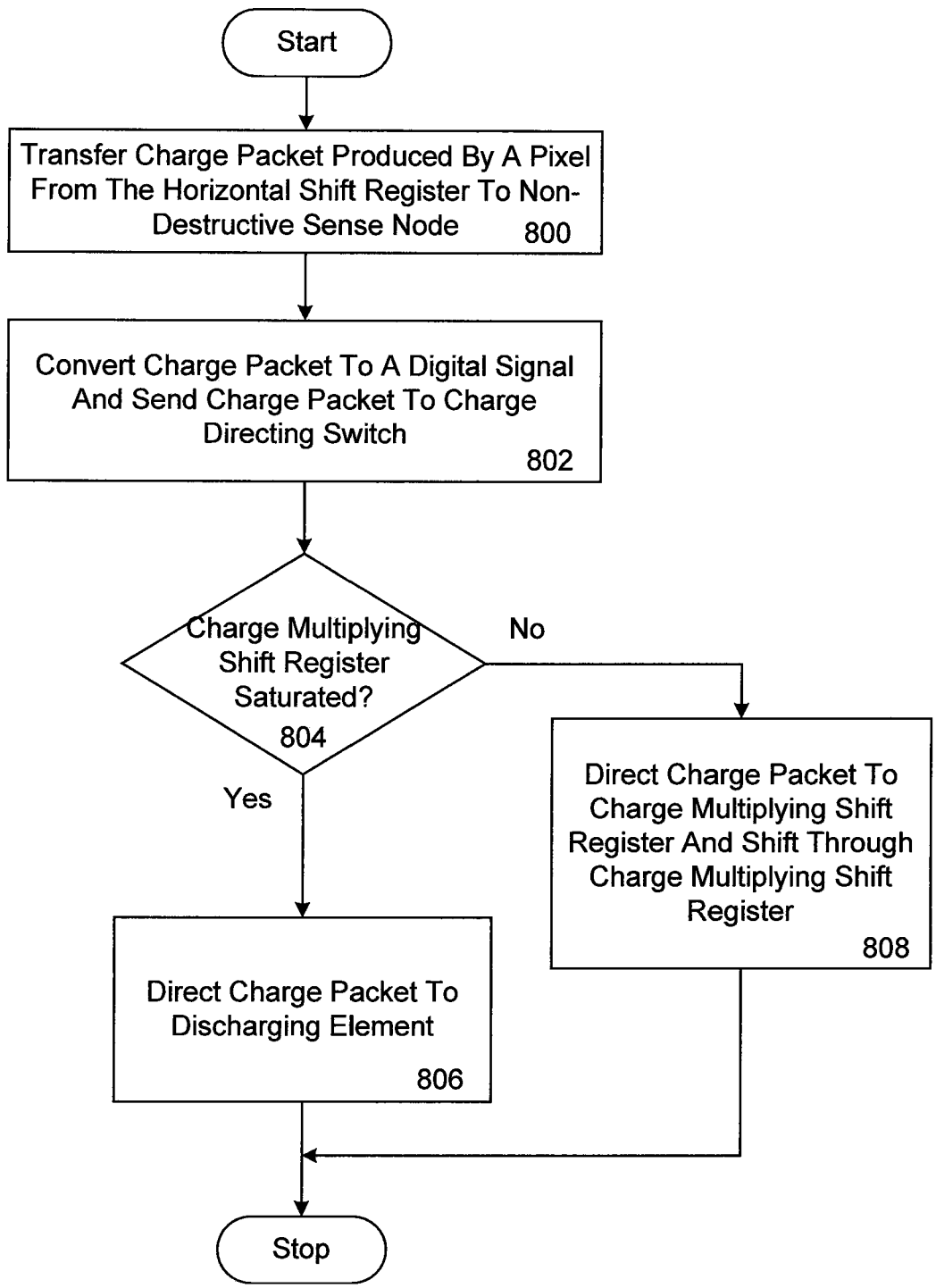
FIG. 8 is a flowchart of a method for operating an image sensor in an embodiment in accordance with the invention.

FIG. 8 is a flowchart of a method for controlling the flow of charge packets in an embodiment in accordance with the invention. Initially, a charge packet is shifted to the non-destructive sense node at block 800. The charge packet is converted to a digital pixel signal representing the amount or number of charge carriers in the charge packet while the charge packet is sent to the charge directing switch (block 802). The charge packet is shifted through a pipeline delay horizontal shift register to send the charge packet to the charge directing switch in an embodiment in accordance with the invention.

A determination is then made at block 804 as to whether or not the number of charge carriers in the charge packet will saturate the charge multiplying horizontal shift register. If the charge packet will saturate the charge multiplying horizontal shift register, the process passes to block 806 where the charge packet is directed to the discharging element. If the charge carriers will not saturate the charge multiplying horizontal shift register, the charge packet is directed to the charge multiplying horizontal shift register and shifted through the charge multiplying horizontal shift register (block 808).

The method depicted in FIG. 8 repeats for each pixel read out of the pixel array. Only charge packets that do not cause blooming are input and shifted through the charge multiplying horizontal shift register. Larger charge packets that cause blooming are directed to the discharging element.

Figure 9:
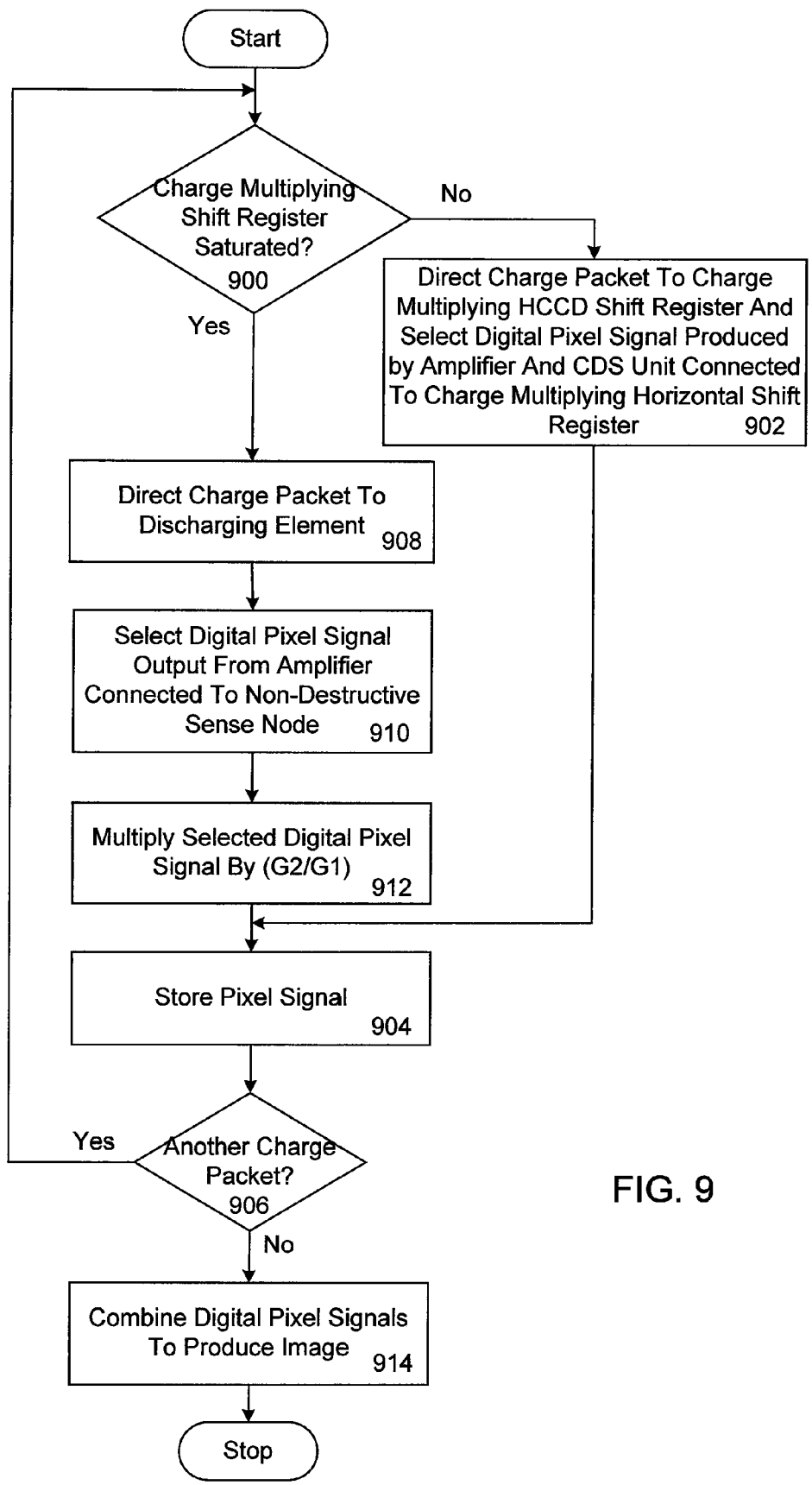
FIG. 9 is a flowchart of a method for producing an image that can be used with the embodiment shown in FIG. 4.

Referring now to FIG. 9, there is shown a flowchart of a method for producing an image that can be used with the embodiment shown in FIG. 4. The value G1 represents the combined charge to voltage conversion gain of the amplifier 408 and output circuit 410. The value G2 represents the combined charge to voltage conversion gain of the output amplifier 418 and output circuit 420.

Initially, a determination is made at block 900 as to whether or not the number of charge carriers in a charge packet will saturate the charge multiplying horizontal shift register. If not, the charge packet is directed to and shifted through the charge multiplying horizontal shift register and the digital pixel signal produced by the output amplifier and output circuit connected to the charge multiplying horizontal shift register is selected as the digital pixel signal (block 902). The digital pixel signal is then stored, as shown in block 904. By way of example only, the digital pixel signal can be stored in memory 310 shown in FIG. 3.

Next, as shown in block 906, a determination is made as to whether or not another charge packet is to be produced by the image sensor. If so, the method returns to block 900. When the number of charge carriers in a charge packet will saturate the charge multiplying horizontal shift register, the process passes to block 906 where the charge packet is directed to the discharging element. The digital pixel signal produced by the amplifier connected to the non-destructive sense node is selected as the digital pixel signal (block 908). The selected digital pixel signal is then multiplied by the gain ratio (G2/G1) at block 910 and the modified digital pixel signal stored at block 904. By way of example only, the gain ratio (G2/G1) can be applied to the selected digital pixel signals by a computing device, such as processor 308 shown in FIG. 3

When all of the charge packets have been processed and there are no more charge packets (block 906), the method passes to block 914 where the stored pixel signals or modified pixel signals are combined to produce an image. Embodiments in accordance with the invention can combine blocks 904 and 914 such that the pixel signals are stored in a location that corresponds to the location of the pixel in the image. Thus, the memory or storage unit stores a completed image when all of the charge packets have been produced by the image sensor.

One process for determining the gain ratio G2/G1 used in the method shown in FIG. 9 will now be described. The G2/G1 gain ratio can be determined from the charge packets that are directed to the charge multiplying horizontal shift register 418 and output circuit 420. Those charge packets are processed by both output circuits 410 and 420. In one embodiment in accordance with the invention, a running average of (the digital pixel signals produced by output circuit 420)/(the digital pixel signals produced by output circuit 410) is determined. This running average equals the gain ratio G2/G1. A running average is used in an embodiment because as the camera temperature changes the gain ratio G2/G1 will likely also change.

Embodiments in accordance with the invention are not limited to the use of a running average. A running least squares fit average can be used in another embodiment in accordance with the invention. Those skilled in the art will appreciate that the running least squares fit average will also correct offset errors.

Figure 10:
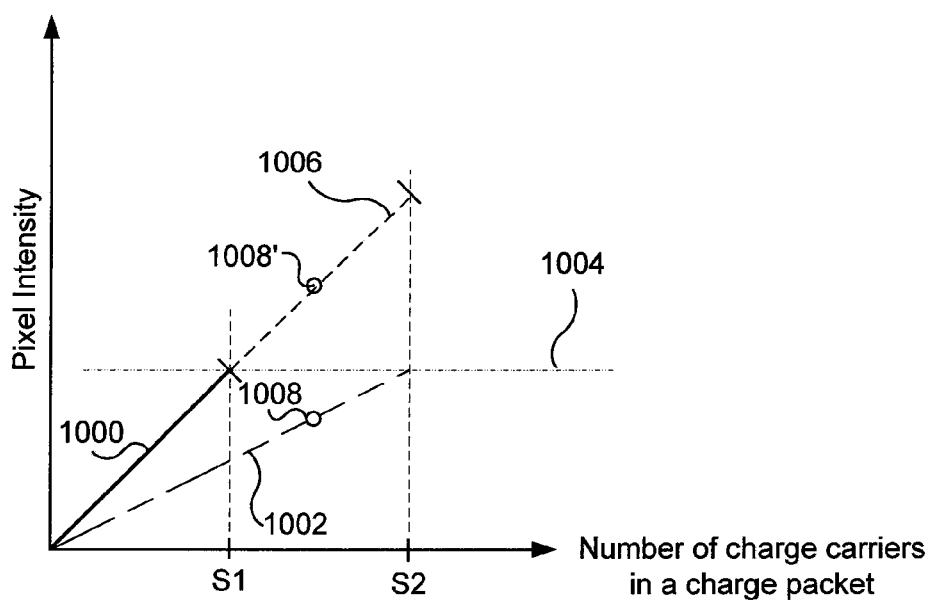
FIG. 10 is an exemplary diagram that is used to illustrate how the signals output from the three output channels are combined to produce an image in an embodiment in accordance with the invention.

FIG. 10 is an exemplary diagram that is used to illustrate how the signals output from the two output channels are combined to produce an image in an embodiment in accordance with the invention. Line 1000 represents the output of the charge multiplying output channel for charge packets having zero to S1 number of charge carriers. Line 1002 represents the output of the charge sensing output channel for charge packets having zero to S2 number of charge carriers. The slope of each line 1000 and 1002 is the output gain G2 and G1, respectively.

Line 1004 represents a saturation level for the amplifiers in the different output channels (e.g., amplifiers 408 and 418). The pixel intensity for all output channels will not exceed this saturation level. Thus, the maximum pixel intensity for an image is limited to the intensity level represented by line 1004.

Output amplifier 418 saturates at a low number of charge carriers S1 and output amplifier 408 at the number of charge carriers S2. If the number of charge carriers is between S1 and S2, the output of the charge sensing output channel is multiplied by the ratio of the slopes of the output lines 1000 and 1002 (i.e., gain ratio G2/G1).

The pixel signals output from the charge sensing output channel are multiplied by a gain ratio to produce an image having a greater range of intensity values. The gain ratio, when applied to the charge packets having a number of charge carriers between S1 and S2, modifies the pixel intensity values such that the intensity values fall along line 1006.

By way of example only, a charge packet is output from the charge sensing output channel having a number of charge carriers that corresponds to point 1008 along line 1002. When the charge packet is multiplied by the gain ratio (G2/G1), the modified pixel intensity value corresponds to point 1008' along line 1006. Thus, the gain ratio produces modified pixel intensities that fall or substantially fall on lines 1006, thereby providing an image with a greater range of pixel intensity values.

Figure 11:
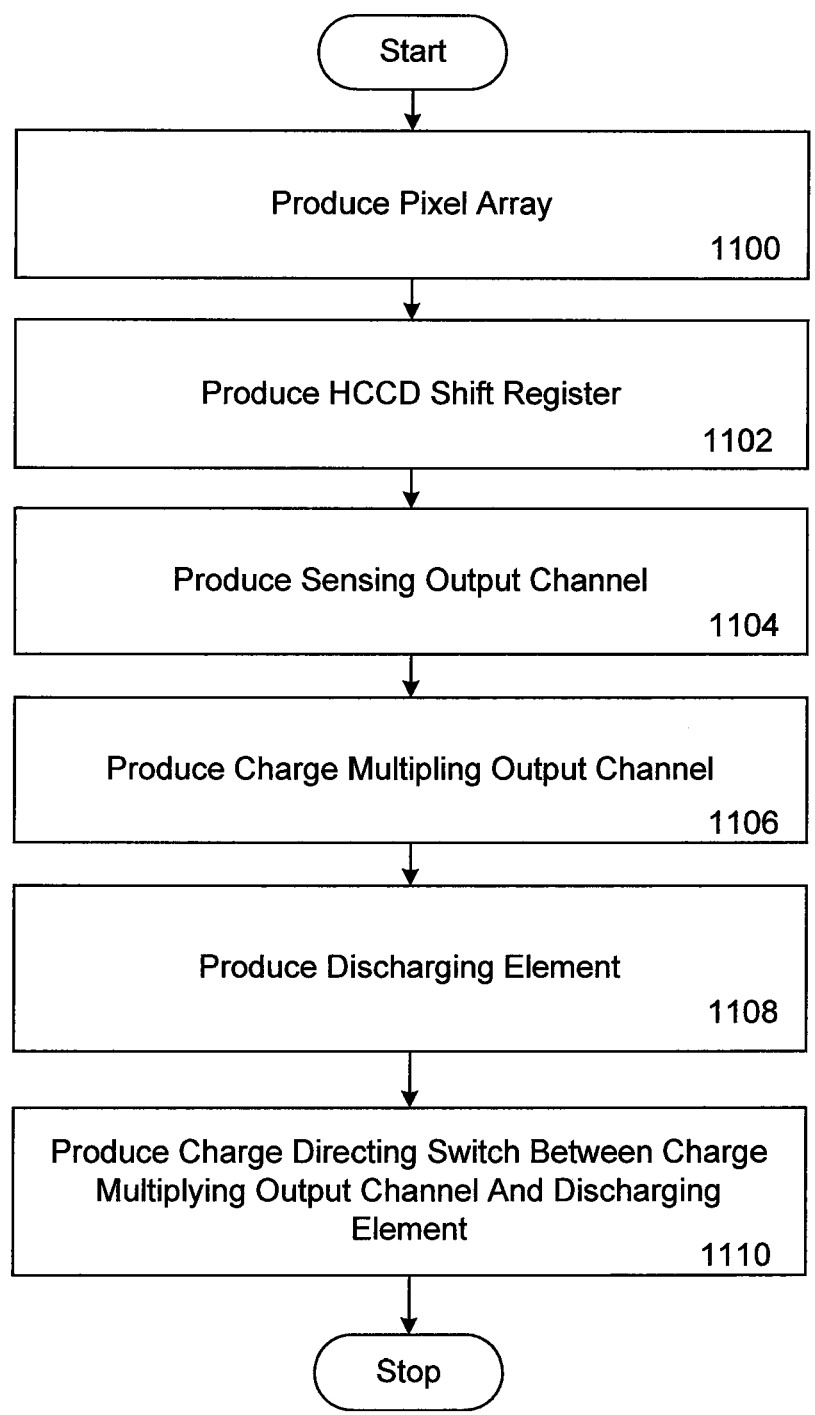
FIG. 11 is a flowchart of a method for producing an image sensor in an embodiment in accordance with the invention.

Referring now to FIG. 11, there is shown a flowchart of a method for producing an image sensor in an embodiment in accordance with the invention. Initially, a pixel array is produced, as shown in block 1100. The pixel array of photodetectors can be produced using techniques known in the art. For example, masking layers can be deposited over a substrate and each patterned to provide openings at the locations where respective components in each pixel (e.g., photodetectors) will be formed. Dopants having particular conductivity types are then implanted into the substrate to produce the components.

Next, as shown in block 1102, a horizontal CCD shift register is produced on one side of the pixel array. The horizontal CCD shift register can be produced using techniques known in the art. For example, a masking layer can be deposited over the substrate and patterned to provide openings at the locations where each shift register element, or phase in each shift register element, will be formed. A dopant having a particular conductivity type is then implanted into the substrate to produce the shift register element or phase. Barrier implants may also be formed between shift register elements or phases. Also, electrodes are produced over each shift register element or phase and electrically connected to respective voltage clocking signals that are used to shift charge packets through the horizontal CCD shift registers. Typically, the electrodes are formed in electrode layers. In a two phase CCD shift register, alternating electrodes (every other electrode) form one electrode layer and the remaining electrodes a second electrode layer. In a four phase CCD shift register, electrodes disposed over the first and third phase (or the second and fourth phase) form one electrode layer and the remaining electrodes a second electrode layer.

Next, as shown in blocks 1104 and 1106, the charge sensing output channel and the charge multiplying output channel are produced. The output channels can be produced using techniques known in the art. For example, a masking layer can be deposited over the substrate and patterned to provide openings at the locations where each shift register element, or phase in each shift register element, will be formed. A dopant having a particular conductivity type is then implanted into the substrate to produce the shift register element or phase. Barrier implants may also be formed between shift register elements or phases. Also, electrodes or gates are produced over each shift register element or phase and electrically connected to respective voltage clocking signals that are used to shift charge packets through the horizontal shift registers. Typically, the gates are formed in layers. In a two phase shift register, alternating gates (every other gate) form one layer and the remaining gates a second electrode layer. In a four phase shift register, gates disposed over the first and third phase (or the second and fourth phase) form one layer and the remaining gates a second electrode layer.

The discharging element is formed at block 1108. The discharging element can be formed using techniques known in the art. And finally, the charge directing switch is produced at block 1110. The charge directing switch can be produced using techniques known in the art. For example, a masking layer can be deposited over the substrate and patterned to provide openings at the locations where each shift register element, or phase in each shift register element, will be formed. A dopant having a particular conductivity type is then implanted into the substrate to produce the shift register element or phase. Barrier implants may also be formed between shift register elements or phases. Also, the gates are produced over each shift register element or phase and electrically connected to respective voltage clocking signals that are used to direct the charge packets through a respective output of the charge directing switch.

Those skilled in the art will recognize that other embodiments in accordance with the invention can modify the order of the blocks shown in FIG. 10. For example, multiple components included in the pixel array, horizontal shift register, charge sensing output channel, or the charge multiplying output channel can be produced at the same time by patterning the masking layers appropriately. Embodiments that include a pipeline delay horizontal shift register or an extended horizontal shift register can produce these elements when producing the desired output channels. Additionally, other components in an image sensor can be produced in between the processes shown in FIG. 10.

The invention has been described in detail with particular reference to certain embodiments thereof, but it will be understood that variations and modifications can be effected within the spirit and scope of the invention. For example, signal levels other than the signal levels shown in FIGS. 7 and 8 can be used. The charge directing switch can be implemented differently in other embodiments in accordance with the invention. An image capture device can include additional components than the components shown in FIG. 3.

And even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

PARTS LIST

100 pixel array
102 pixel
105 horizontal CCD shift register
110 charge multiplying horizontal CCD shift register
120 output amplifier
200 output amplifier
300 image capture device
302 light
304 imaging stage
306 image sensor
308 processor
310 memory
312 display
314 other input/output (I/O)
400 image sensor
402 pixel array
404 horizontal CCD shift register 406 non-destructive sense node
408 amplifier
410 output circuit
412 pipeline delay horizontal shift register
414 charge directing switch
416 charge multiplying horizontal shift register
418 amplifier
420 output circuit
422 discharging element
424 extended horizontal CCD shift register
500 gate
502 gate
504 gate
506 gate
508 gate
1000 line representing output of the charge multiplying output channel
1002 line representing output of the charge sensing output channel
1004 line representing a saturation level
1006 line representing pixel intensity values
1008 pixel intensity value
1008' modified pixel intensity value
S1 value representing a number of charge carriers
S2 value representing a number of charge carriers

The invention claimed is:

1. A method for producing an image capture device comprising:
   providing a horizontal shift register electrically connected to a pixel array for receiving charge packets from the pixel array;
   providing a non-destructive sense node connected to an output of the horizontal shift register;
   providing a charge directing switch electrically connected to the non-destructive sense node, wherein the charge directing switch includes first and second outputs;
   providing a charge multiplying horizontal shift register electrically connected to the first output of the charge directing switch;
   providing a discharging element connected to the second output of the charge directing switch;
   providing a computing device electrically connected to the charge directing switch, wherein the computing device is operable to transmit a switch signal to the charge directing switch in response to a signal received from the non-destructive sense node;
   providing a pipeline delay horizontal shift register connected between the non-destructive sense node and the charge directing switch; and
   providing a length of the pipeline delay horizontal shift register based on a pipeline delay time of the first amplifier and the first output circuit.

2. The method as in claim 1, further comprising:
   providing a first amplifier connected to the non-destructive sense node; and
   providing a second amplifier connected to an output of the charge multiplying horizontal shift register.

3. The method as in claim 2, further comprising:
   providing a first output circuit connected to an output of the first amplifier; and
   providing a second output circuit connected to an output of the second amplifier, wherein the first and second output circuits each include an analog-to-digital converter electrically connected to the outputs of the first and second amplifiers.

4. The method as in claim 1, further comprising providing an extended horizontal shift register connected between the first output of the charge directing switch and the input of the charge multiplying horizontal shift register.

* * * * *